United States Patent [19]

Webler et al.

[11] Patent Number: 4,604,588

[45] Date of Patent: Aug. 5, 1986

[54] DIGITAL DELAY LINE TESTER

[75] Inventors: Thomas N. Webler, West Chester; William A. Lacher, Lansdale, both of Pa.

[73] Assignee: Burroughs Corporation, Detroit, Mich.

[21] Appl. No.: 711,058

[22] Filed: Mar. 12, 1985

[51] Int. Cl.[4] ............................................. G01R 25/00
[52] U.S. Cl. ................................ 331/135; 324/83 FE; 324/85
[58] Field of Search ....................... 331/57, 108 B, 135, 331/137; 324/57 DE, 73 R, 78 Z, 83 FE, 83 R, 85; 328/66, 129.1

[56] References Cited

U.S. PATENT DOCUMENTS 2,622,127 12/1952 Alsberg et al. .................... 324/85 X

FOREIGN PATENT DOCUMENTS 0634216 11/1978 U.S.S.R. ........................... 324/83 R

Primary Examiner—Eugene R. Laroche
Assistant Examiner—Robert J. Pascal
Attorney, Agent, or Firm—Francis A. Varallo; Mervyn L. Young; Kevin R. Peterson

[57] ABSTRACT

The present invention describes a tester for determining the value of unknown delay lines in the nanosecond and subnanosecond range. The unknown delay line is introduced into the circuit loop of a free-running square wave oscillator previously calibrated to a predetermined frequency. A change in oscillator frequency occurs which is a measure of the value of the delay introduced into the loop by the unknown line. Such delay may be calculated as a function of the calibration and delay line-measured frequencies. The present tester provides measurements with increased accuracy and rapidity over previous measuring techniques.

11 Claims, 7 Drawing Figures

DIGITAL DELAY LINE TESTER

BACKGROUND OF THE INVENTION

In the design of electronic equipment and systems, delay lines are frequently employed. Up until the present, the most reliable, accurate and accepted method of measuring delay lines made use of a pulse generator and a sampling oscilloscope. Such a method was satisfactory for the following reasons. The delay lines in use typically provided a delay greater than 10 nanoseconds. The pulse generators needed to obtain the delay measurements were required to provide output pulses having 1.0 nanosecond rise times. Such generators are relatively inexpensive and widely available. Most users of the delay lines already had a sampling oscilloscope and the required parts to construct a test fixture. The latter fixture was relatively simple and parisitic reactive effects were substantially negligible.

More recently, the quest for increased speed in electronic systems has led to the need for delay lines within the 1 to 5 nanosecond range, and even a delay of 0.50 nanoseconds is possible. The above mentioned pulse generator/oscilloscope technique is not applicable to measurements of such short lines. A number of problems arise when use of the last mentioned technique is contemplated. Pulse generators are required with pulse rise times much less than 1.0 nanosecond and these are very expensive. The sampling oscilloscope and associated probes must have extremely wide bandwidths. The parasitic effects which heretofore were negligible, became important to the extent that the layout of the test fixture is now a critical factor. Moreover, the trace width of the sampling oscilloscope introduces considerable error in the measurements. Variations in the impedance of the delay line may interfere with the ability to read the oscilloscope correctly. In addition, the process of making such measurements is tedious and time consuming.

What is desired is a delay line tester useful in the nanosecond and subnanosecond range which obviates the foregoing measurement problems. The digital tester of the present invention fills such a need and does so with an inexpensive stand-alone unit providing measurements with greatly increased accuracy and rapidity over previous measuring methods.

SUMMARY OF THE INVENTION

In accordance with the present invention there is provided a test-head comprised of a free-running oscillator and a socket disposed within the oscillator loop and having a pair of terminals for connection to the delay line under test. Initially, the last mentioned terminals are short circuited and with the implicit delay in the oscillator circuit itself, designated dc, the frequency, fc which is equal to 1/2dc is adjusted to a predetermined value, such as 100 MHz used in an actual operative embodiment of the tester. The short circuit is then removed and the unknown delay line is connected between the socket terminals. The measured frequency of oscillation, fm, is then counted and the unknown delay, dx, is calculated from a simple equation:

$$fm = \frac{1}{2(dc + dx)}$$

and the unknown delay is $$dx = \frac{1}{2}\left(\frac{1}{fm} - \frac{1}{fc}\right)$$

where "dx" is in seconds and "fm", "fc" are in Hz.

The foregoing equations are accurate provided that "dc" is reasonably small and the frequency counter reasonably accurate. Satisfactory results have been obtained with a "dc" equal to 10.0 nanoseconds and a frequency divider of 32,000 applied to the output frequencies of the test-head oscillator. The divider derives its accuracy from a crystal source which is 0.01% accurate. The division by 32,000 limits the counter-size and sensitivity to reasonable numbers. Utilizing these parameters, lines having delays in the order of 0.50 nanoseconds have been accurately measured.

The above-mentioned equation for the unknown delay "dx" is readily calculated by a microprocessor incorporated into the tester. The unknown delay value is displayed decimally in nanoseconds to two significant figures to the right of the decimal point. The microprocessor then repeats the procedure, recalculating the unknown delay time 250 times a second. The resulting display is a non-flickering, accurate, easy-to-read number accurate to ±10 picoseconds for unknown delays of less than 3.0 nanoseconds.

Other features and advantages of the tester of the present invention will become apparent in the detailed description which follows.

DESCRIPTION OF THE PREFERRED EMBODIMENT

Figure 1:
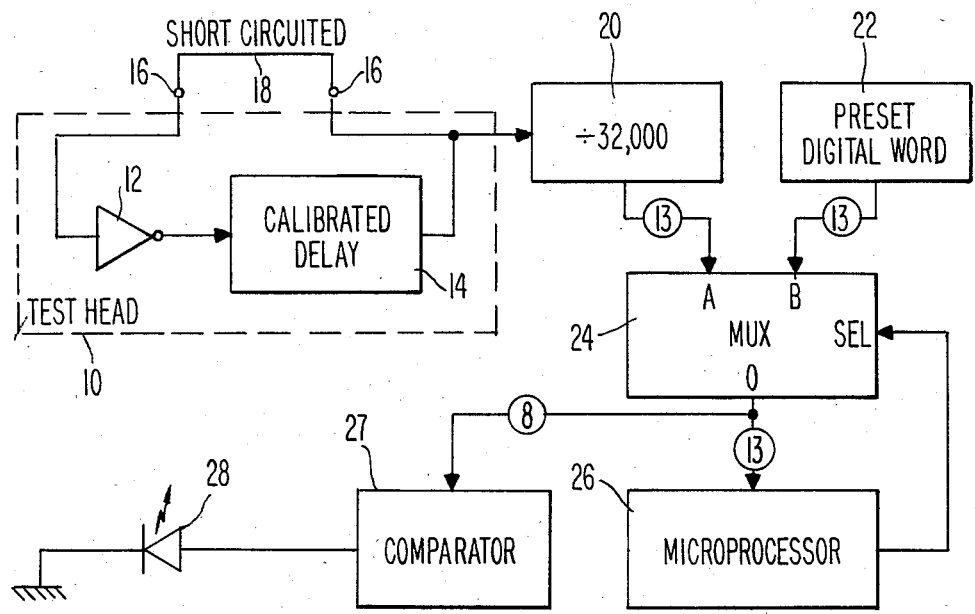
FIG. 1 is a simplified block diagram of the digital delay line tester in a calibration mode.

The digital delay line tester of the present invention is depicted in highly simplified form in FIG. 1, which indicates a calibration mode.

The test head 10 provides a free-running oscillator implemented by inverter 12 and having an implicit delay which is manually adjustable by delay means 14. In practice, the oscillator loop may be entered at terminals 16. In the calibration mode, the terminals 16 are short circuited by electrical conductor 18 and means 14 adjusted to vary the frequency of the test head signal output. The oscillator signals out of the test head are applied to counters 20 which effect a frequency division of 32,000. The preset digital word 22 represents a predetermined frequency, such as 100 MHz used in an actual operative tester, divided by 32,000. The respective 13 bit digital words representing the oscillator frequency and the predetermined calibration frequency are applied to the input terminals "A" and "B" of multiplexer 24. Microprocessor 26 performs a select function of the two multiplexer inputs in accordance with its output signal to the SEL terminal of multiplexer 24. Comparator 27 compares 8 bit digital words representative of the test head output frequency and the predetermined 100 MHz calibration frequency. An LED indicator 28, driven by the comparator circuits, will light when manual adjustment of delay means 14 provides a test head output frequency equal to 100 MHz.

Figure 2:
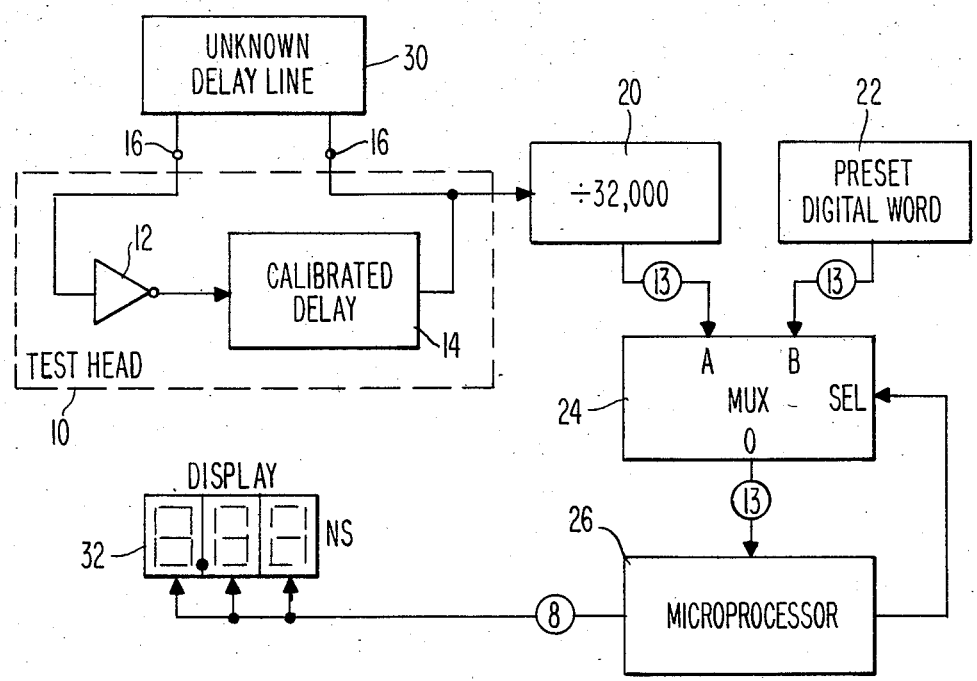
FIG. 2 is a simplified block diagram of the digital delay line tester in its operational mode.

After calibration has been accomplished, an operational mode as depicted in highly simplified form in FIG. 2 is established. The electrical conductor 18 (FIG. 1) shorting terminals 16 is removed and the unknown delay line 30 whose delay is to be measured by the tester is placed between terminals 16. The frequency of the output signals of the test head are now a function of the unknown delay line 30 under test. As in the calibrate mode, the frequency output of the test head is divided by 32,000. The output of the divider and the preset digital word are applied to respective input terminals of multiplexer 24. Microprocessor 26 by virtue of its select function, constantly and alternately reads in the test head frequency digital word representing the unknown delay line and the preset digital word that corresponds to 100 MHz. The microprocessor 26 is programmed to solve the relatively simple equations involving the last mentioned digital words and to display the decimal value of the delay of the line under test in display unit 32. In an operative embodiment, the unknown delay value was displayed decimally in nanoseconds, as seen in FIG. 2, to two significant figures to the right of the decimal point. Recalculations by the microprocessor 26 at a rate of 250 times per second, result in a non-flickering number accurate to ±10 picoseconds, for lines having delays less than 3.0 nanoseconds.

Figure 3:
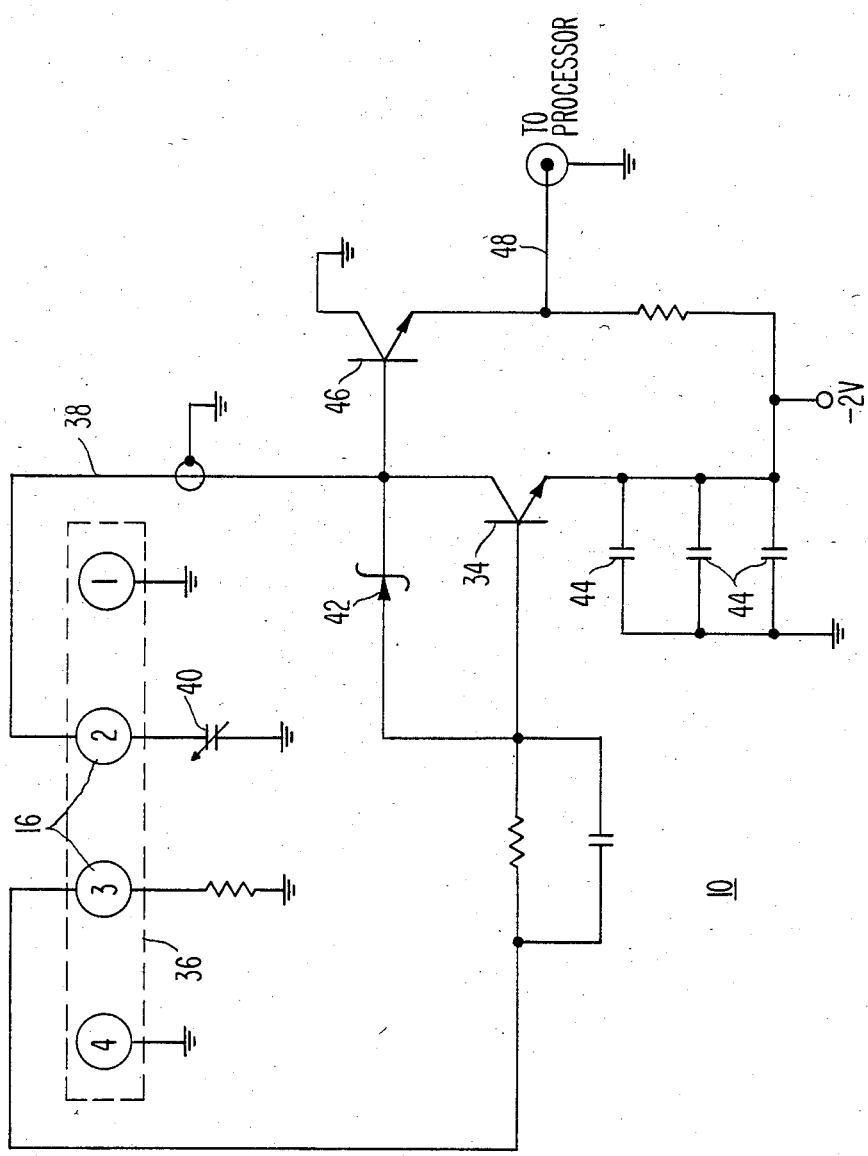
FIG. 3 is a schematic diagram of the test head shown in FIGS. 1 and 2 and adapted to receive the unknown delay line.

FIG. 3 provides an electrical schematic of the test head 10 shown in simplified form in FIGS. 1 and 2. With reference to FIG. 3, a free-running square wave oscillator utilizes transistor 34 in an inverting common emitter configuration—equivalent to inverter 10 of FIGS. 1 and 2. The oscillator loop includes a socket 36 having terminals 16. Delay in the loop (with terminals 16 short circuited) is effected by the implicit delay in transistor 34, the 50 ohm coaxial line 38, and the setting of variable capacitor 40. In general, the length of the coaxial line 38 is chosen to generate an oscillation frequency of approximately 100 MHz, the calibration frequency. A precise adjustment of the last mentioned frequency is accomplished by manually varying the value of capacitor 40.

When the calibration frequency is realized, the short circuit between terminals 16 is removed, and the unknown delay line (30 in FIG. 2) connected between the last mentioned terminals. The oscillator frequency is now directly proportional to the unknown delay. It should be noted that the actual delay in the loop, designated "d", is half the period of the square wave cycle. Stated another way, the output frequency of the test head is equal to 1/2d.

The Schottky diode 42 prevents saturation of transistor 34 and speeds up operation. The shunt capacitors 44 interposed between the emitter of transistor 34 and ground are of different values such that ac signals over a wide frequency band will be by-passed to ground. Output transistor 46 performs a voltage level shifting function on the oscillator signals which make them ECL compatible with the tester circuits of FIG. 4 to which the signals are applied via coaxial line 48.

Figure 4:
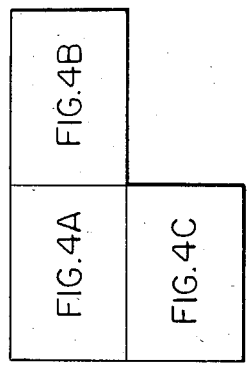
FIG. 4 comprises FIGS. 4A, 4B, 4C, which together form a detailed circuit diagram of the delay line tester of the present invention.
Figure 4A:
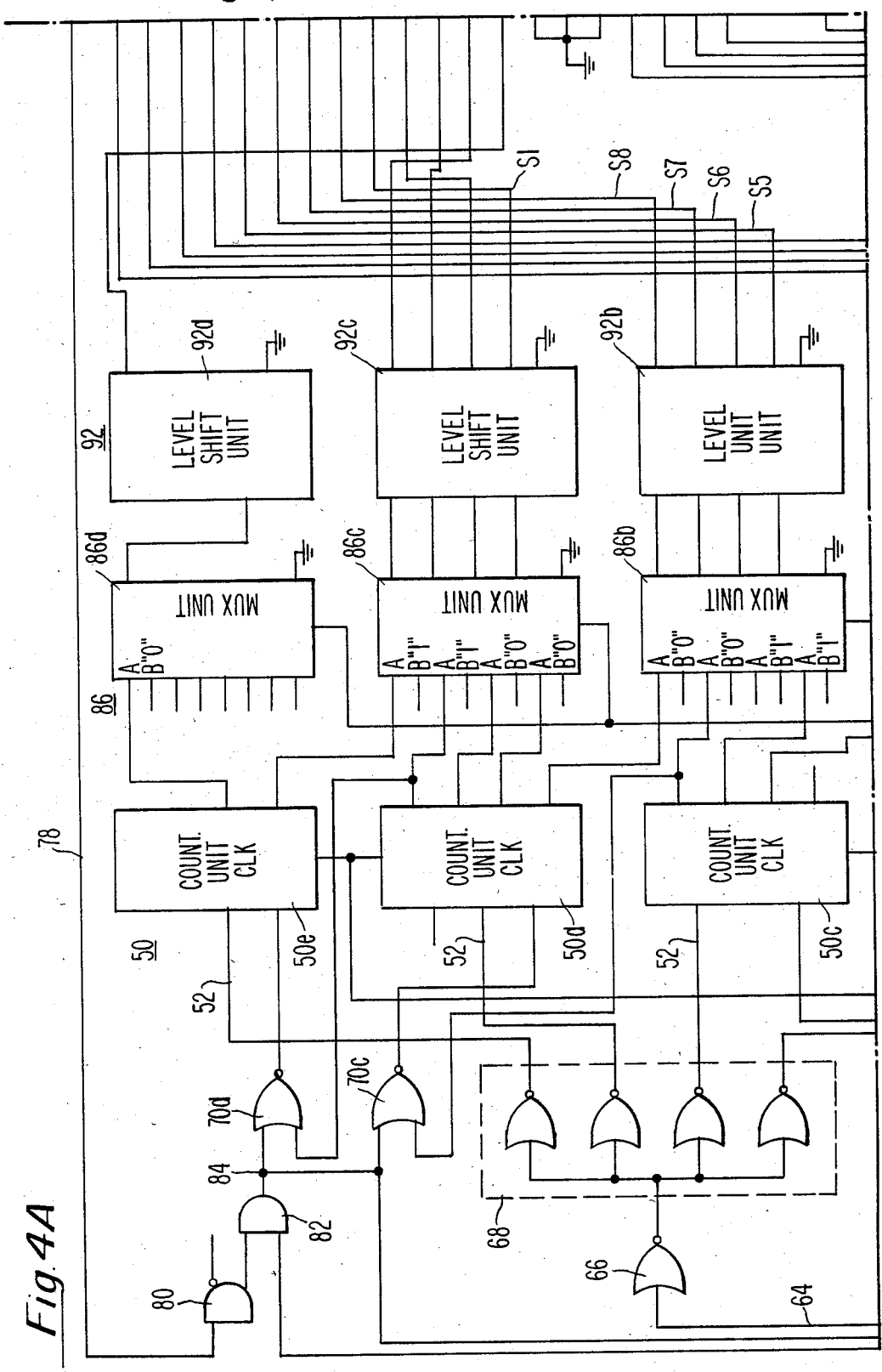

FIG. 4 is a detailed circuit diagram of an actual operative embodiment of the digital delay line tester of the present invention. With reference to FIGS. 4A and 4C, the input circuits and counters will now be described.

INPUT CIRCUITS AND COUNTERS

The output of the test head is an ECL square wave signal appearing on line 48. As noted hereinbefore, the signal is calibrated to 100 MHz with a short circuit across the terminals 16 of the test head socket 36. Line 48 is a coaxial cable to minimize signal distortion. A counter 50 comprised of counter units 50a, 50b, 50c, 50d, and 50e are depicted. The counter 50 is used in two different modes—count up and reset. Each of the counter units has a mode select line 52. The square wave output signal from the test head 10 is applied to the clock terminal CLK of counter 50a.

Figure 4B:
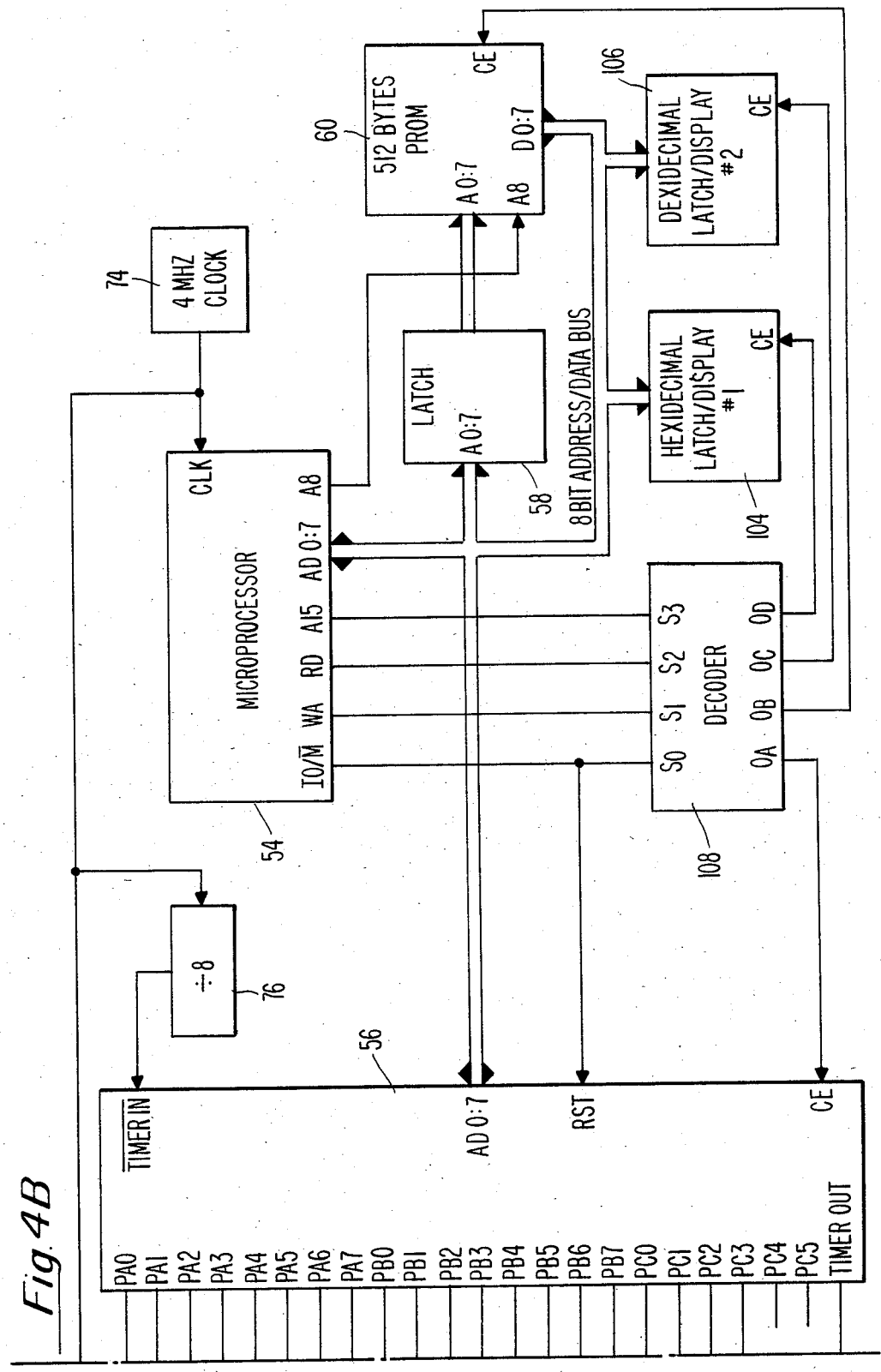
Figure 4C:
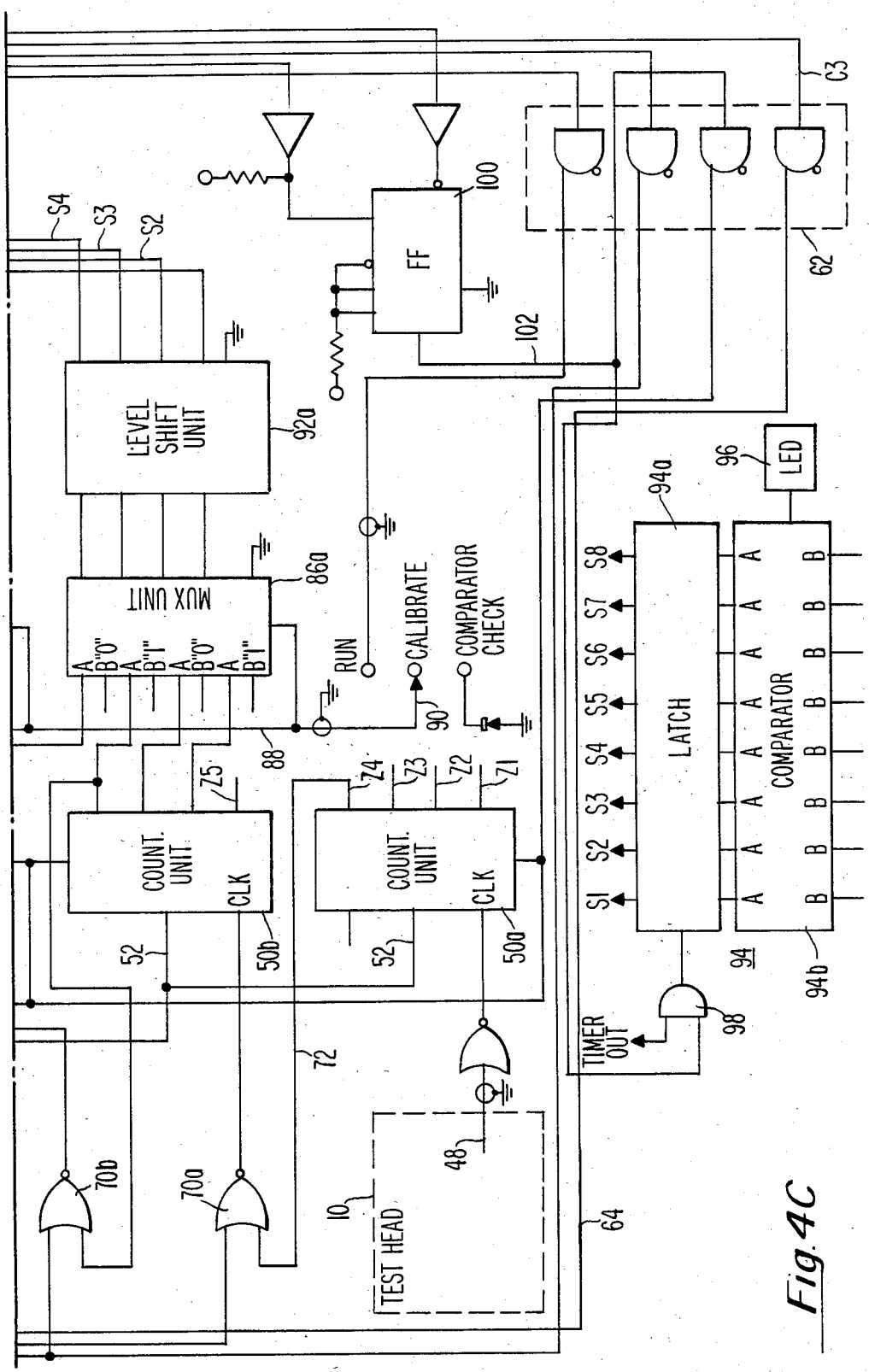

As seen in FIG. 4B, a microprocessor 54 is provided. All of the mode select lines 52 of the counter 50 are connected in common and are under control of the microprocessor 54. It should be observed that the processor elements (chips) are configured in a conventional manner. With continued reference to FIG. 4B, element 56 is a programmable I/O, timer and RAM chip; element 58 is an 8 bit address latch; and PROM chip 60 provides 512 bytes of programmable memory. Chip 56 handles all communication between the high speed counter 50 and microprocessor 54. Chip 56 has three ports which may be configured in many different ways. In the present application, ports A and B are used strictly as input ports and port C as an output (control) port. The respective mode select lines 52 of counter 50 are controlled directly through port C, line PC3.

In the operative embodiment of FIG. 4, the microprocessor 54 utilized in the tester operates with TTL signals, whereas as noted hereinbefore, the counter units 50a-50e are ECL. Accordingly, signals from the microprocessor must be translated to ECL levels if they are to control the counter 50. The chip 62 comprised of a plurality of gates performs this level-shifting function for the respective microprocessor signals appearing on terminals PCO:3 of element 56. The mode select signal from element 56, port C, PC3, after being translated in chip 62, appears on line 64 and is applied via buffer 66 in common to the input terminals of a plurality of NOR gates 68. The respective outputs of the last mentioned gates are applied to the mode select lines 52 of the counter 50.

NOR gates 70a, 70b, 70c, and 70d serve two purposes. First, they propagate the most significant bit of the last counter into the clock input of the next stage when the counter is in a count-up mode. For example, the output on line 72 of counter unit 50a is applied via gate 70a to the clock input CLK of counter 50b. Moreover, gates 70a-70d enable a clock pulse from the microprocessor 54, clock terminal CLK into the respective clock CLK inputs of the counter units 50a-50e during the reset thereof. The microprocessor clock is derived from a stable 4 MHz (±0.01%) crystal source 74 for use by the microprocessor 54 and the counter 50. The 4 MHz clock is further counted down by divider element 76 for use by processor chip 56, as will be considered hereinafter. It should be noted that the 4 MHz clock pulses on line 78 are also TTL and must be level shifted by gate 80 and are then buffered by AND gate 82 such that the output of the last mentioned gate on line 84 is applied in common to an input terminal of each of the NOR gates 70a, 70b, 70c, 70d. The respective outputs of the last mentioned NOR gates are applied to the clock terminals of counters 50b, 50c, 50d and 50e.

A multiplexer 86 with units 86a, 86b, 86c and 86d are provided. The outputs of counter units 50 are applied respectively to the "A" inputs of multiplexer 86. The "B" inputs of the multiplexer 86 are hardwired to receive the bits of a preset binary word, namely "0110000110101", derived from the 100 MHz calibration frequency divided by 32,000. Either the "A" inputs or the "B" inputs may be selected by the common RUN/-CALIBRATE line 88. When the RUN/CALIBRATE switch 90 is in the CALIBRATE position, the counter outputs are selected as inputs to the multiplexer 86. When the switch 90 is in the CALIBRATE-CHECK position, the hardwired digital word is the selected input to the multiplexer 86. When switch 90 is placed in the RUN position, the multiplexer select line 88 is under control of microprocessor 54. The multiplexer 86 provides a 13 bit digital word output that represents a frequency to the microprocessor. The multiplexer outputs are translated from ECL to TTL by level shifter 92 having units 92a, 92b, 92c and 92d and the respective outputs of the last mentioned chip are applied to the "A" and "B" input ports of processor chip 56. Thus, level shift unit 92a provides inputs to "A" terminals of unit 56, PAO:3; unit 92b, PA4:7, unit 92c, to "B" terminals, PBO:3; unit 92d, PB4.

CALIBRATION

With continued reference to FIG. 4, the hard-wired 13 bit digital word represents a calibration frequency of 100 MHz in the present operative tester. The frequency of the test head oscillator with a short circuit placed in the delay line socket is calibrated to be precisely 100 MHz by doing a continuous comparison of the test head oscillator frequency to the preset digital word and manually adjusting a variable capacitor 40 (FIG. 3) to achieve such comparison.

Microprocessor 54 is designed to run only one program. However, the digital delay line tester has two modes of operation, selected by the position of the RUN/CALIBRATE switch 90. With the switch 90 in the CALIBRATE position, only the signal frequency on the multiplexer "A" terminals, derived from the test head oscillator output is permitted to pass through the multiplexer 86. The select line 88 to the multiplexer 86 is kept "low". By ensuring that the outputs of the multiplexer will not change, the latch/comparator circuits 94 will provide an indication that calibration has been accomplished. The latch circuits 94a receive 8 bits of data representing the test head output from selected level shifter or output lines, S1 to S8 inclusive, and apply them to the "A" input terminals of the comparator 94b. Likewise 8 bits of the present word representative of the 100 MHz calibration frequency are read into in the "B" register of the comparator 94b. When the "A" word and the "B" word correspond to each other, the comparator outputs a signal to the LED indicator 96. That is, when the test head oscillator is running at exactly 100 MHz (as a result of manual fine tuning of capacitor 40), the LED indicator 96 lights and calibration is verified. It should be noted that in the operative tester, satisfactory calibration was effected using only 8 of the 13 bits in the respective digital words, although more than 8 bits may be used if desired.

AND gate 98 at the entrance to the comparator circuits cooperates with the output of flip-flop 100 on line 102 to guarantee that the comparator/latch 94 is only operational when the test head frequency count is valid. The valid time is derived from two outputs of processor element 56, namely, signals on the TIMER OUT and PORT C, PC1 terminals.

OPERATION

When switch 90 is placed in the RUN position, the microprocessor 54 constantly changes the level on the select line 88 of the multiplexer 86. When the line is "low", the microprocessor 54 reads in, through the multiplexer 86, the test head frequency that represents the delay line under test. When the select line 88 is "high", the microprocessor 54 reads in the preset digital word on the multiplexer "B" terminals that corresponds to 100 MHz.

Before proceeding with the operations performed by the microprocessor in determining the delay time of the line being tested, it may be helpful to review some pertinent equations.

The frequency of the square wave signal out of the test head, V out (t), is equal to 1/2d where 2d is the period of the square wave cycle and is twice the delay in the loop. As noted hereinbefore, the test head loop contains an implicit delay, dc, (with the test socket terminals shorted) and the frequency "fc" (100 MHz in the present embodiment) is equal to 1/2dc. Accordingly, the measured frequency, fm, is equal to 1/2(dc+dx). Solving for dx, the delay of the line under test, yields the following equation:

$$dx = \frac{1}{2}\left(\frac{1}{fm} - \frac{1}{fc}\right)$$

where dx is in seconds; fm, fc, in Hz.

With the foregoing equations as background, the microprocessor 54 is programmed to solve the following equation:

$$d'x = 1,562,500\left(\frac{1}{f'm} - \frac{1}{f'c}\right)$$

where d'x is in units of 10 picoseconds or $10^{-11}$ seconds; f'm and f'c are in Hz divided by 32,000. The constant 1,562,500 is derived as follows. As noted hereinbefore, the counter-size and sensitivities were limited to reasonable numbers, by dividing the input frequencies by 32,000. For example, if fc=100 MHz then $$f'c = \frac{100 \times 10^6}{32,000} = 3125$$

which is the hard-wired preset word in decimal mentioned hereinbefore. The constant "K" is necessary to reconcile the units chosen to represent the delay time. Thus, $$d'x = K\frac{1}{2}\left(\frac{1}{f'm} - \frac{1}{f'c}\right)$$

or $$dx \cdot 10^{11} = K\frac{1}{2}\left(\frac{32000}{fm} - \frac{32000}{fc}\right)$$

and

-continued $$dx = 1.6 \times 10^{-7} K \left( \frac{1}{fm} - \frac{1}{fc} \right)$$

Since our original equation for $$dx =$$

$$\frac{1}{2} \left( \frac{1}{fm} - \frac{1}{fc} \right) \text{ then } 1.6 \times 10^{-7} K = \frac{1}{2} \text{ and } K = 3,125,000$$

Returning to the original equation above for d'x and substituting 3,125,000 for K, we arrive at the equation to be solved, namely $$d'x = 1,562,500 \left( \frac{1}{fm} - \frac{1}{fc} \right)$$

The program strategy of the microprocessor 54 is as follows:
1. Read in the 13 bit number from the test head.
2. Read in the 13 bit preset word.
3. Solve the equation for d'x.
4. Convert the binary numeral to decimal.
5. Display the decimal value of the delay line.
6. Go to step 1.

Steps 1 and 2 above are accomplished by outputting from the microprocessor 54 to the processor element 56 Port "C" output lines the correct sequence of four bit words. These control signals along with the TIMER OUT signal from element 56 perform the switching between the reference preset digital 100 MHz word and the test head frequency dependent upon the unknown delay, as well as division by 1,000 in the counter 50. The TIMER OUT signal is a precise 1.0 kHz square wave produced by element 56 from its TIMER IN signal, which comes from divider 76, which generates the divided microprocessor clock. Now, by only enabling the counter 50 to count for 1.0 millisecond, an effective division by 1,000 is done. The division by 32 is accomplished by ignoring the first five counter outputs, lines Z1, Z2, Z3, Z4 of counter 50a and line X5 of counter unit 50b.

Step 3 is implemented with a non-restoring division algorithm in accordance with the microprocessor machine code stored in the PROM 60 and accessed via latch 58. Scratch pad and long-term memory are in element 56.

Step 4 is accomplished with software in the microprocessor 54.

Step 5 is implemented with hexidecimal latch/display elements 104 and 106. Decoder 108 handles all of the bus traffic.

Step 6 is accomplished with a "jump" command.

In conclusion, the delay line tester of the present invention provides an accurate measure of delay lines in the nanosecond and subnanosecond range. The measurements are made with considerable savings of test time. The circuit elements and parameters associated therewith, as presented hereinbefore, refer to an actual operative tester; are submitted soly for purposes of example; and are not to be construed as limitative of the invention. Changes and modifications of the circuit organization presented herein may be needed to suit particular requirements. For example, the microprocessor 54 utilized in the tester is a TTL type 8085; the element 56, type 8156; and latch 58, 8212. These may be replaced with ECL processor elements, thereby eliminating all those elements described herein as level shifters or converters. Similarly, a reference frequency other than 100 MHz may be used, and a frequency division, other than 32,000, might be utilized, notwithstanding the fact that the foregoing parameters have produced highly satisfactory results. In view of the foregoing, all changes and modifications as are well within the skill of the circuit designer, insofar as they are not departures from the true scope and spirit of the invention, are intended to be covered by the following claims.

What is claimed is:

1. A tester for measuring the value of the delay present in an unknown delay line comprising:
a test head having a free-running square wave oscillator configured in a circuit loop, means for selectively coupling said unknown delay line into said circuit loop, said oscillator including inverter means and having oscillator fine-tuning means for effecting a predetermined calibration frequency in the absence of said unknown delay line in said circuit loop, means for determining the frequency of the square wave signals generated by said oscillator,
whereupon the coupling of said unknown delay line into said circuit loop causes the frequency of said oscillator to change from said calibration frequency to a measured frequency in direct proportion to the value of the delay introduced into said circuit loop by said unknown delay line, said last mentioned value being equal to one half of the difference in the periods of the respective square wave signals at said calibration and measured frequencies.

2. A tester as defined in claim 1 wherein said frequency of the square wave signals generated by said oscillator is a function of the delay in said inverter means, a predetermined length of coaxial cable forming a portion of said circuit loop and said oscillator fine-tuning means.

3. A tester as defined in claim 2 wherein said oscillator fine-tuning means is a variable capacitor.

4. A tester as defined in claim 3 wherein said means for selectively coupling said unknown delay line into said circuit loop includes a pair of spaced-apart terminals disposed in said loop whereby a discontinuity is provided in the electrical path of said loop, electrical conductor means for short circuiting said terminals when said tester is in a calibration mode, said unknown delay line being connected across said terminals when said tester is in an operation mode.

5. A tester as defined in claim 4 wherein said inverter means comprises a transistor having an emitter, a collector, and a base electrode, said transistor being coupled in an inverting common emitter configuration, said circuit loop coupling said collector electrode to said base electrode, said emitter electrode being coupled to a source of reference potential.

6. A tester as defined in claim 5 wherein said predetermined length of coaxial cable couples said collector electrode of said transistor to one of said pair of spaced-apart terminals, said variable capacitor being coupled between said last mentioned one of said terminals and said source of reference potential.

7. A tester as defined in claim 4 further including counter means coupled to said oscillator for dividing the frequency of said square wave signals by a predetermined factor, multiplexer means having a first and a second plurality of terminals, said first plurality of multiplexer terminals being coupled to said counter means for receiving a first digital word representative of the oscillator frequency, means for coupling a second preset digital word representative of said calibration frequency into said second plurality of multiplexer terminals, and control means coupled to said multiplexer means for selectively outputting said first and second digital words from said multiplexer means.

8. A tester as defined in claim 7 further including comparator means operatively coupled to said multiplexer means whereby at least respective homologous portions of said first and second digital words are compared to each other during said tester calibration mode, said oscillator frequency and said first digital word being varied in response to the circuit capacitance provided by said variable capacitor, and means coupled to said comparator means for indicating the correspondence of said first and second digital words, thereby confirming the attainment of said predetermined calibration frequency.

9. A tester as defined in claim 8 further characterized in that said control means comprises processor means, said processor means being operatively coupled to receive said first digital word representative of said measured frequency during said tester operation mode and said second preset digital word representative of said calibration frequency, whereby said processor means performs a repetitive calculation of the delay of said unknown delay line by first inverting and then subtracting said first and second digital words from each other, multiplying the remainder by a constant derived from the frequency division effected by said counter means and the predetermined units in which said delay is presented, and further converting said delay from a binary to a decimal form.

10. A tester as defined in claim 9 further including display means coupled to said processor means for displaying said delay of said unknown delay line.

11. A tester as defined in claim 10 further characterized in that said calibration frequency is 100 MHz. and the numerical value of the frequency division effected by said counter means is 32,000.

* * * * *